US006193807B1

(12) United States Patent
Tateyama et al.

(10) Patent No.: US 6,193,807 B1
(45) Date of Patent: *Feb. 27, 2001

(54) SUBSTRATE CONVEYING DEVICE AND SUBSTRATE CONVEYING METHOD

(75) Inventors: Kiyohisa Tateyama; Tatsuya Iwasaki, both of Kumamoto (JP)

(73) Assignee: Tokyo Electron Limited (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/472,177

(22) Filed: Dec. 27, 1999

Related U.S. Application Data

(62) Division of application No. 09/078,537, filed on May 13, 1998, now Pat. No. 6,062,241.

(30) Foreign Application Priority Data

May 15, 1997 (JP) .................................... 9-139141

(51) Int. Cl.[7] ................. B08B 3/00; B08B 3/04
(52) U.S. Cl. ................ 134/2; 134/133; 134/902; 134/21
(58) Field of Search ................ 134/2, 21, 6, 61, 134/66, 133, 902

(56) References Cited

U.S. PATENT DOCUMENTS

| | | | |
|---|---|---|---|
| 3,853,313 | * | 12/1974 | Appenzeller et al. . |
| 4,618,292 | * | 10/1986 | Judge et al. . |
| 4,773,687 | * | 9/1988 | Bush et al. . |
| 4,846,626 | * | 7/1989 | Engelbrecht . |
| 4,984,966 | * | 1/1991 | Szarka . |
| 5,011,366 | * | 4/1991 | Miller . |
| 5,177,514 | * | 1/1993 | Ushijima et al. . |
| 5,183,370 | * | 2/1993 | Cruz . |
| 5,226,636 | * | 7/1993 | Nenadic et al. . |
| 5,277,539 | * | 1/1994 | Matsui et al. . |
| 5,310,442 | * | 5/1994 | Ametani . |
| 5,324,155 | * | 6/1994 | Goodwin et a l. . |
| 5,374,829 | * | 12/1994 | Sakamoto et al. . |
| 5,518,542 | * | 5/1996 | Matsukawa et al. . |
| 5,553,396 | * | 9/1996 | Kato et al. . |
| 5,556,147 | * | 9/1996 | Somekh et al. . |
| 5,578,127 | * | 11/1996 | Kimura . |
| 5,622,400 | * | 4/1997 | George . |
| 5,695,817 | | 12/1997 | Tateyama et al. .................... 427/240 |
| 5,738,165 | * | 4/1998 | Imai . |
| 5,765,889 | * | 6/1998 | Nam et al. . |
| 5,967,159 | * | 10/1999 | Tateyama ............................... 134/61 |

FOREIGN PATENT DOCUMENTS

| | | | |
|---|---|---|---|
| 3817615 | * | 8/1989 | (DE) . |
| 000555890 A2 | * | 8/1993 | (EP) . |
| 363155635A | * | 6/1988 | (JP) . |
| 404057638A | * | 2/1992 | (JP) . |
| 405198657A | * | 8/1993 | (JP) . |
| 405343499A | * | 12/1993 | (JP) . |
| 406182686 | * | 7/1994 | (JP) . |

* cited by examiner

Primary Examiner—Zeinab El-Arini
(74) Attorney, Agent, or Firm—Rader, Fishman & Grauer

(57) ABSTRACT

According to the present invention, there is provided a substrate conveying device and method for loading/unloading a substrate to/from a processing section, including an arm for holding the substrate, an arm drive mechanism for driving the arm such as to load/unload the substrate to/from the processing section, a first suction pad provided on the arm, for suctioning the substrate, a second suction pad provided on the arm at a position adjacent to that of the first suction pad, for suctioning the substrate, and a projecting member provided between the first and second suction pads of the arm, so as to control a posture of the substrate to be suctioned one of the first and second suction pads as the projecting member abuts the lower surface of the substrate.

9 Claims, 7 Drawing Sheets

SUBSTRATE CONVEYING DEVICE AND SUBSTRATE CONVEYING METHOD

This application is a divisional of application Ser. No 09/078,537 filed May 13, 1998, now U.S. Pat. No. 6,062,241.

BACKGROUND OF THE INVENTION

The present invention relates to a substrate conveying device for conveying a substrate such as a semiconductor wafer or an LCD glass substrate, between a cassette and a processing unit.

Generally, in the manufacture of a liquid crystal display, photolithography is employed so as to form a circuit, an electrode pattern or the like, on a substrate such as a glass substrate. In the photo-lithography, a series of processing steps, namely, the washing and drying of a substrate, the formation of a resist film on the substrate, the exposure of the resist film, the development, and the like, are carried out. In the processing device for carrying out these processing steps, substrates unloaded from a cassette placed in the cassette station are conveyed to the processing unit one by one while being held on an arm, and the substrates are subjected to the processing steps including washing, one after another. After that, the substrates which have been processed at each processing unit, are conveyed back into the cassette one by one while being held on the arm.

However, with regard to the upper surface of the arm for conveying substrates, in the case where the section of the upper surface, for supporting an unwashed substrate, and the section for supporting a washed substrate are used in common, the following problem easily occurs. That is, when an unwashed substrate is placed on the arm, a contaminant attached to the rear surface of the unwashed substrate is transferred onto the supporting section of the arm, and the transferred contaminant may then easily be further transferred via the arm onto the rear surface of a washed substrate, while conveying the washed substrate on the arm. In order to solve the described problem, for example, Jpn. Pat. Appln. KOKAI Publication No. 5-152266 proposes a substrate conveying device. More specifically, in the substrate conveying device disclosed in Jpn. Pat. Appln. KOKAI Publication No. 5-152266, a substrate unloading arm for taking out an unwashed substrate from a cassette, and conveying it to the washing unit, and a substrate loading arm for returning a substrate finished with washing in the washing unit, to the cassette are formed to be separate mechanisms, so as to avoid the reattachment of a contaminant.

However, in the substrate conveying device disclosed in Jpn. Pat. Appln. KOKAI Publication No. 5-152266, which switches the substrate unloading arm and the processed substrate loading arm before and after washing, the entire arm is, for example, rotated, and therefore a wide space is required for fully moving the arm therein. Thus, the space of the device cannot be effectively used. Further, in the case where separate mechanisms are used as a substrate unloading arm, and a processed substrate loading arm as in the prior art substrate conveying device, separate loading and unloading arms must be prepared. Further, the drive mechanism for switching the loading and unloading arms is relatively large in size. Therefore, the entire structure becomes very complicated.

BRIEF SUMMARY OF THE INVENTION

The object of the present invention is to provide a substrate conveying device capable of avoiding, for example, the reattachment of a contaminant onto a substrate, with a simple structure, as well as a method therefor.

In order to achieve the above-described object, according to the first aspect of the present invention, there is provided a substrate conveying device for loading/unloading a substrate to/from a processing section, comprising:

an arm for holding the substrate;

an arm drive mechanism for driving the arm such as to load/unload the substrate to/from the processing section;

a first suction pad provided on the arm, for suctioning the substrate;

a second suction pad provided on the arm at a position adjacent to that of the first suction pad, for suctioning the substrate;

a projecting member provided between the first and second suction pads of the arm, so as to control a posture of the substrate to be suctioned one of the first and second suction pads as the projecting member abuts the lower surface of the substrate; and a switching mechanism for selectively switching a mode between the first and second suction pads for suctioning the substrate by turning the arm over.

In the substrate conveying device, for unloading an unwashed substrate from a cassette, and conveying it to a processing section, the lower surface of the substrate is suctioned only by, for example, the first suction pad. By contrast, for returning a substrate washed in the processing section to a cassette, the lower surface of the substrate is suctioned only by, for example, the second suction pad. During this operation, the posture of a substrate is appropriately controlled by the projecting member, the substrate is not pressed against the first suction pad.

With the above-described structure, unwashed substrates and washed substrates can be held on the same arm but suctioned by different suction pads, the re-attachment of contaminant on a washed substrate can be prevented.

Further, it is preferable that the first and second suction pads should be formed of an elastically deformable material, and one of the first and second suction pads, which suctions the substrate should be elastically deformed such that the height thereof is lower than the other suction pad.

Furthermore, it is preferable that the first and second suction pads should be provided at a plurality of locations on both sides of an imaginary center line which corresponds to the periphery of the substrate, and one of the suction pads should be situated on the inner side of the substrate while the other pad should be situated on the outer side of the substrate.

According to the second aspect of the present invention, there is provided a substrate conveying device for loading/unloading a substrate to/from a processing section, comprising:

an arm, having one surface and another surface, for holding the substrate;

an arm drive mechanism for driving the arm such as to load/unload the substrate to/from the processing section;

a first suction pad provided on the one surface of the arm, for suctioning the substrate;

a second suction pad provided on the another surface of the arm for suctioning the substrate; and a switching mechanism for selectively switching a mode between the first and second suction pads for suctioning the substrate by turning the arm over.

With the above-described structure, the first and second adsorption pads can be switched over by reversing the arm. Therefore, unwashed substrates and washed substrates can be held by the same arm, and still the contamination via the suction pad can be prevented.

According to the third aspect of the present invention, there is provided a substrate conveying method for conveying a substrate with use of a substrate conveying device including, an arm for holding the substrate thereon, first and second suction pads provided on the arm for selectively suctioning the substrate, a projecting member provided between the first and second suction pads of the arm; the method comprising the steps of:

loading an unwashed substrate in the processing section while holding the unwashed substrate with the first suction pad by suction and the projecting member abutting the lower surface of the unwashed substrate so as the unwashed substrate to be suctioned by the first suction pad; and unloading a washed substrate from the processing section while holding the washed substrate with the second suction pad by suction and the projecting member abutting the lower surface of the unwashed substrate so as the unwashed substrate to be suctioned by the second suction pad.

According to the fourth aspect of the present invention, there is provided a substrate conveying method for conveying a substrate with use of a substrate conveying device including, an arm for holding the substrate thereon, first suction pad provided on one surface of the arm, second suction pad provided on another surface of the arm, and a switching mechanism for selectively switching a mode between the first and second suction pads for suctioning the substrate by turning the arm over; the method comprising the steps of:

loading an unwashed substrate in the processing section while holding the unwashed substrate with the first suction pad by suction;

turning the arm so as the second suction pads to be located the upper side of the arm; and unloading a washed substrate from the processing section while holding the washed substrate with the second suction pad by suction.

With the above-described method, unwashed substrates and washed substrates can be held by the same arm, and still the contamination via the suction pad can be prevented.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
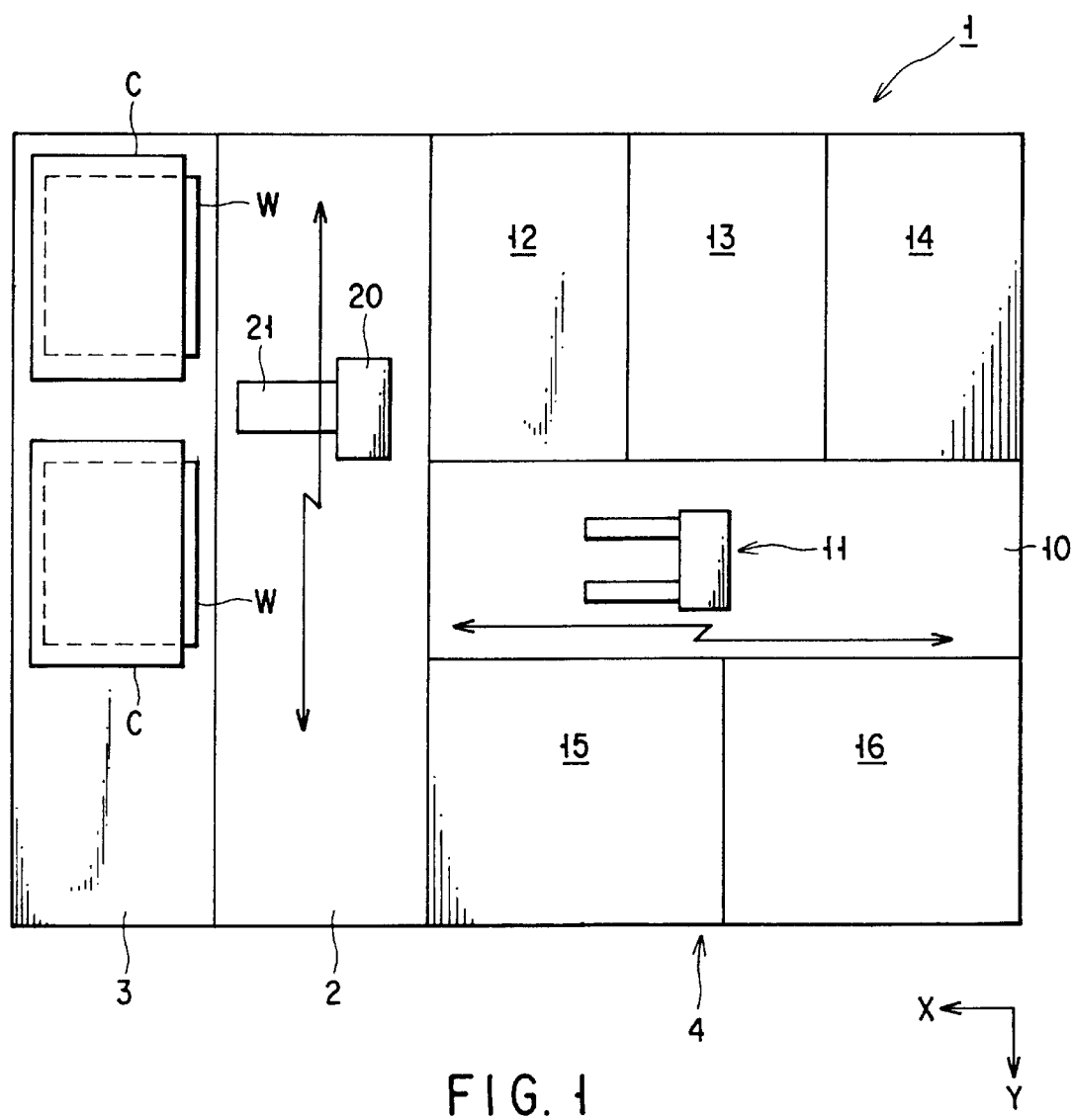
FIG. 1 is a plan view of a washing apparatus.

A preferred embodiment of the present invention will now be described in connection with a washing apparatus 1 for washing a substrate W as an object to be processed. FIG. 1 is a plan view of the washing apparatus 1 for washing a substrate W such as a semiconductor wafer or an LCD substrate. The washing apparatus 1 includes a substrate conveying device 2 according to the embodiment of the present invention, and a cassette station 3 and a washing device 4 located on the respective sides of the substrate conveying device 2 to face each other.

In the cassette station 3, cassettes C loaded by, for example, a conveying robot (not shown) are placed. In each of the cassettes C, a plurality of substrates W are stored as they are arranged in a horizontal position to be parallel with each other with a predetermined interval therebetween. A substrate W is, for example, a semiconductor wafer having a round disk shape, or an LCD glass substrate having a rectangular shape.

A conveying passage 10 is formed at the center of the washing device 4, and a main conveying arm 11 is moved along the conveying passage 10. In the embodiment shown in the figure, scrubber units 15 and 16 for washing substrates W using pure wafer or various types chemicals such as an ammonium aqueous solution, a hydrogen peroxide aqueous solution and a hydrogen fluoride aqueous solution, are provided on one side of the conveying passage 10. Further, dryer units 12, 13 and 14 used for drying substrates W are arranged on the other side of the conveying passage 10. As the main conveying arm 11 conveys the substrates W to the units 12 to 16 in a predetermined order, as it moves along the conveying passage 10, the substrates are subjected to the washing process.

The substrate conveying device 2 has an arm 21 mounted onto the front surface of the base 20. In the substrate conveying device 2, the base 20 can be moved in the XY direction, ascended/descended in the vertical direction, and rotated around the vertical axis. As the base 20 moves as just-described, an unwashed substrate W is unloaded from a cassette C placed in the cassette station 3, and conveyed while the substrate W being held on the arm 21 to be passed onto the main conveying arm 11 of the washing device 4. Then, a substrate w already washed in the washing device 4 is received from the main conveying arm 11 and conveyed while being held on the arm 21, to be returned to the cassette C in the cassette station 3.

The base 20 is supported by a forward/backward mechanism 22 for moving the base 20 set in the posture shown in FIG. 2, forward or backward horizontally in the X axial direction, with respect to the cassette C, a rotation ascending/descending mechanism 23 for rotating or ascending/descending the arm 21 by supporting the lower surface of the forward/backward mechanism 22 rotatably and ascendably/descendably, and a lateral movement mechanism 25 for moving the arm 21 in the lateral direction as it supports the rotation ascending/descending mechanism 23 from the bottom and travels along a rail 24 provided in the Y axial direction. As the forward/backward mechanism 22, the rotation ascending/descending mechanism 23 and the lateral movement mechanism 25 move in cooperation with each other, the arm 21 is moved upwards while the arm 21 is being fit in the cassette C placed in the cassette station 3. Thus, an unwashed substrate W can be unloaded from the cassette C. Then, thus unloaded substrate W is conveyed while being held on the arm 21, and passed on to the main conveying arm 11 of the washing device 4, which stands by in the rear side of the substrate conveying device 2. In the case where a substrate W already washed in the washing device 4 is returned to the cassette C, the substrate W is placed on the arm 21 by the main conveying arm 11, and then conveyed while being held on the arm 21, to be returned to the cassette C of the cassette station 3.

On the upper surface of the arm 21, first suction (adsorption) pad 31 and second suction pad 32 are provided at, for example, three locations. Although a detailed structure will be described later on, with the first suction pad 31 and the second suction pad 32, the states where the lower surface of a substrate W is suctioned by only the first suction pad 31 onto the upper surface of the arm 21, and where the lower surface of a substrate W is suctioned by only the second suction pad 32 onto the upper surface of the arm 21, can be switched over.

Figure 3:
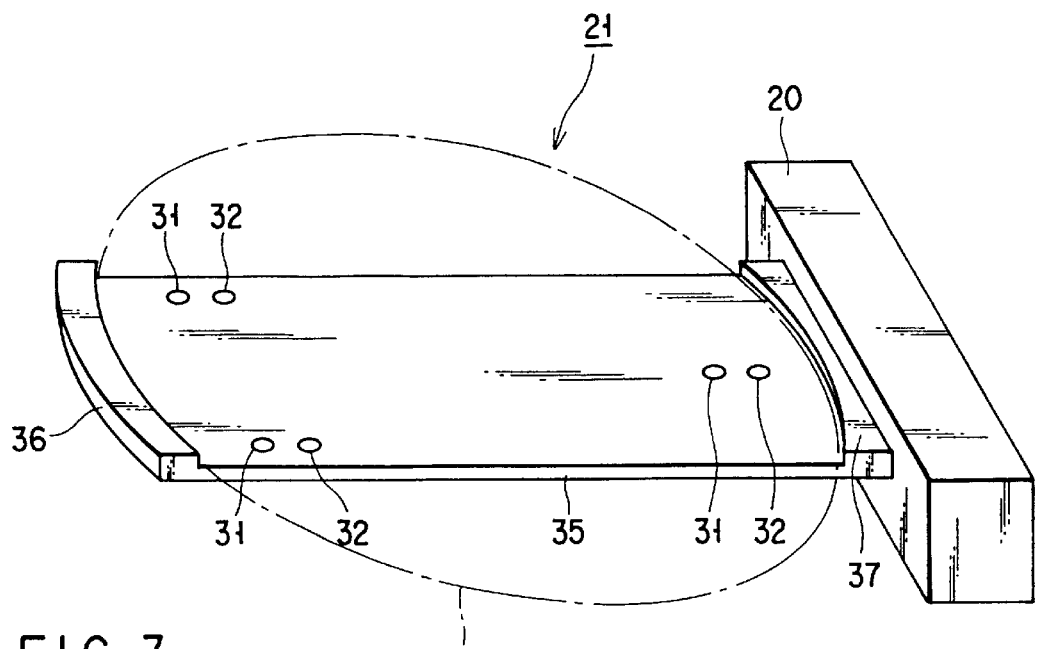
FIG. 3 is a perspective view of an arm appropriate for conveying a substrate such as a semiconductor wafer.

FIG. 3 is a perspective view of the arm 21 suitable for conveying a substrate W such as a semiconductor wafer having a round disk shape, in particular. As can be seen in the figure, the arm 21 consists of the base 20 and a plate member 35 mounted onto the front surface of the base 20. On the upper surface of the plate member 35, the first suction pad 31 and the second suction pad 32 are provided at three locations. Further, at the distal and proximal end portions of the plate member 35, guides 36 and 37 are provided respectively, so as to position the periphery of a substrate W such as a semiconductor wafer. With the guides 36 and 37, the states where the lower surface of a substrate W positioned between the guides 36 and 37 is suctioned by only the first suction pad 31 onto the upper surface of the plate member 35, and where the lower surface of a substrate W is suctioned by only the second suction pad 32, can be switched over.

Figure 4:
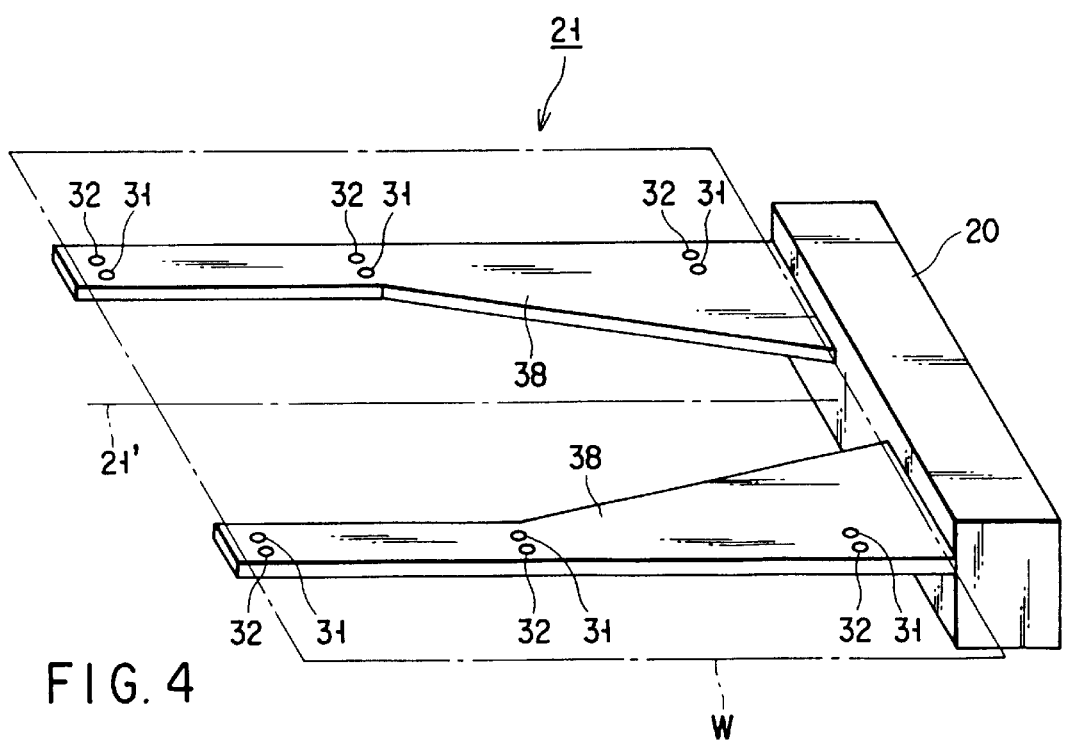
FIG. 4 is a perspective view of an arm appropriate for conveying a substrate such as an LCD glass substrate.

FIG. 4 is a perspective view of the arm 21 suitable for conveying a substrate W such as an LCD glass substrate having a rectangular shape, in particular. As can be seen in the figure, the arm 21 consists of the base 20 and two arm members 38 mounted onto the front surface of the base 20. On the upper surface of the arm members 38, the first suction pad 31 and the second suction pad 32 are provided at three locations in each arm member; therefore six locations in total. With the described structure, the states where the lower surface of a substrate W is suctioned by only the first suction pad 31 onto the upper surfaces of the two arm members 38, and where the lower surface of a substrate W is suctioned by only the second suction pad 32, can be switched over.

As described above, the shape of the arm 21 may be freely selected, for example, one plate member 35 or two arm members 38. Further, it suffices if the first and second suction pads 31 and 32 are provided at least three locations on the upper surface of the arm 21, so as to stably support the lower surface of the substrate W.

In the washing device 1 shown in FIG. 1, first, a cassette C conveyed by the conveying robot or the like is placed in the cassette station 3. In the cassette C, unwashed substrates W are stored to be parallel in a multi-step arrangement.

Then, the operation for unloading substrates W from the inside of the cassette C is started by using the arm 21 of the substrate conveying device 2. More specifically, the forward/backward mechanism 22, the rotation ascending/descending mechanism 23 and the lateral movement mechanism 25, illustrated in FIG. 2, are operated in cooperation with each other, so as to move the arm 21. Thus, the arm 21 is inserted to the cassette C placed in the cassette station 3, and the arm 21 is moved upwards. In this manner, a substrate W stored in the cassette C is held up from below, and the lower surface of the substrate W is suctioned by one the first suction pad 31. Then, the substrate W thus held on the arm 21 is unloaded from the cassette C.

Next, while maintaining the state where the lower surface of the substrate W thus unloaded is suctioned only by the first suction on the arm 21, the forward/backward mechanism 22, the substrate W is conveyed by operating the rotation ascending/descending mechanism 23 and the lateral movement mechanism 25 in cooperation with each other, and passed onto the main conveying arm 11 standing by in the rear of the substrate conveying device 2. As the main conveying arm 11 moves on, thus passed substrate W is carried to each of the units 12 to 16 in a predetermined order, where the respective processes are performed on the substrate W. When the washing process in the washing device 4 is finished, the substrate W is set in a stand-by status in the rear of the substrate conveying device 2 in the posture held on the main conveying arm 11 of the washing device 4.

Figure 2:
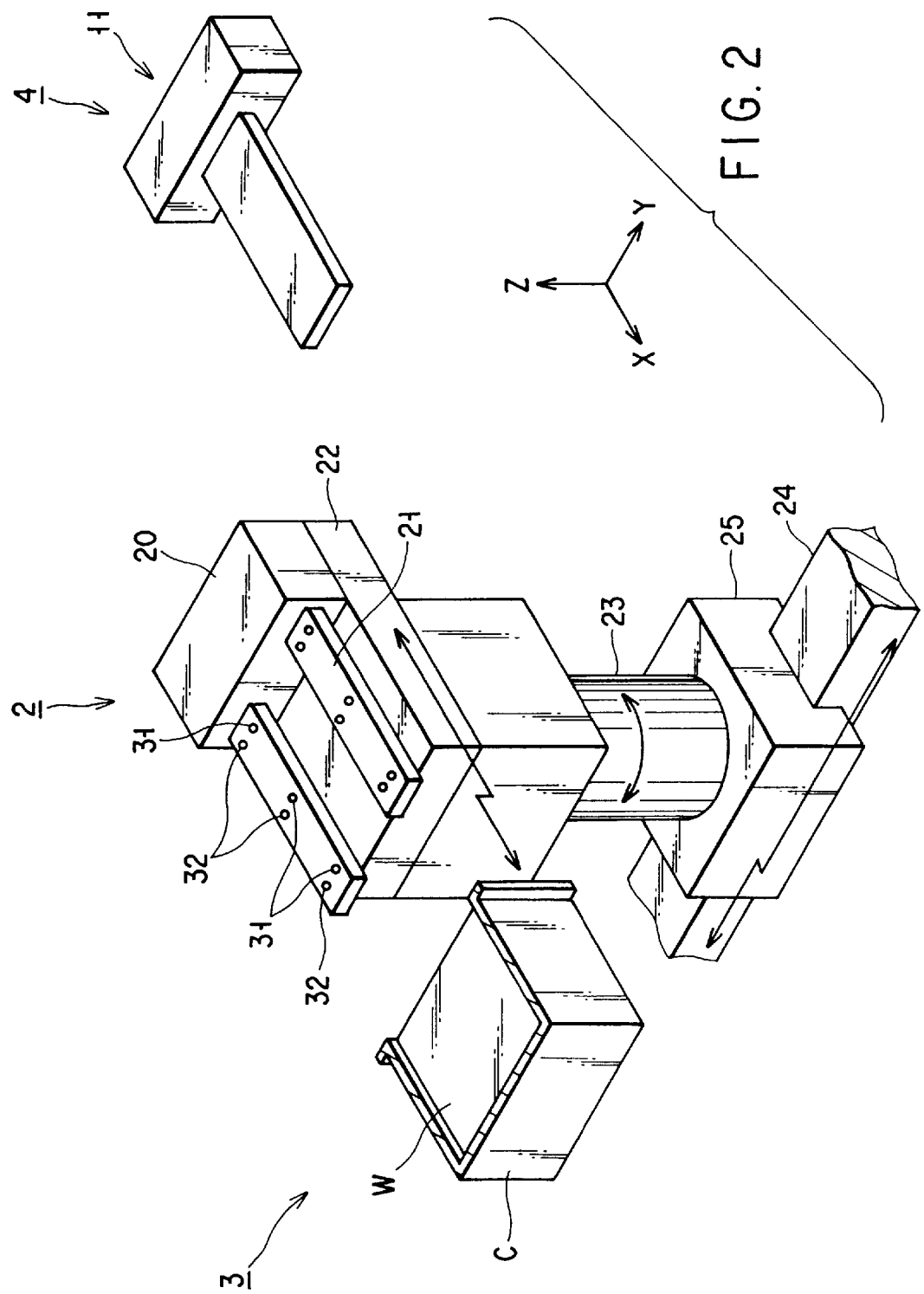
FIG. 2 is a perspective view of a substrate conveying device according to an embodiment of the present invention.

In order to return a substrate W washed in the washing process in the washing device 4 to the cassette C, the washed substrate W is placed using the main conveying arm 11 on the arm 21 which can be moved by operating the forward/backward mechanism 22, the rotation ascending/descending mechanism 23 and the lateral movement mechanism 25, illustrated in FIG. 2, in cooperation with each other. Then, the substrate W is conveyed while being held on the arm 21, and returned to the cassette C in the cassette station 3. As the above-described operation is repeated and the all the substrates W stored in the cassette C are finished with the washing process, the cassette C is unloaded from the cassette station 3 by the conveying robot or the like.

To summarize, in the substrate conveying device 2 according to this embodiment, substrates W are conveyed between a cassette C placed in the cassette station 3 and the main conveying arm 11 of the washing device 4 in the following manner. That is, an unwashed substrate W is suctioned only by the first suction pad 31, whereas a washed substrate W is suctioned only by the second suction pad 32. Therefore, even if some contaminant is transferred from the lower surface of the unwashed substrate W to the first suction pad 31, the contaminant is not re-attached to a washed substrate W. It should be noted that the re-attachment of contaminant can be prevented if the substrate conveying device 2 of this embodiment has a structure in which an unwashed substrate W is suctioned only by the second suction pad 32 and conveyed from a cassette C to the main conveying arm 11, and a washed substrate W is suctioned only by the first suction pad 31 and conveyed from the main conveying arm 11 to a cassette C.

A preferable structure of each of the first and second suction pads 31 and 32 employed in the substrate conveying device 2 of the present invention will now be described.

Figure 5:
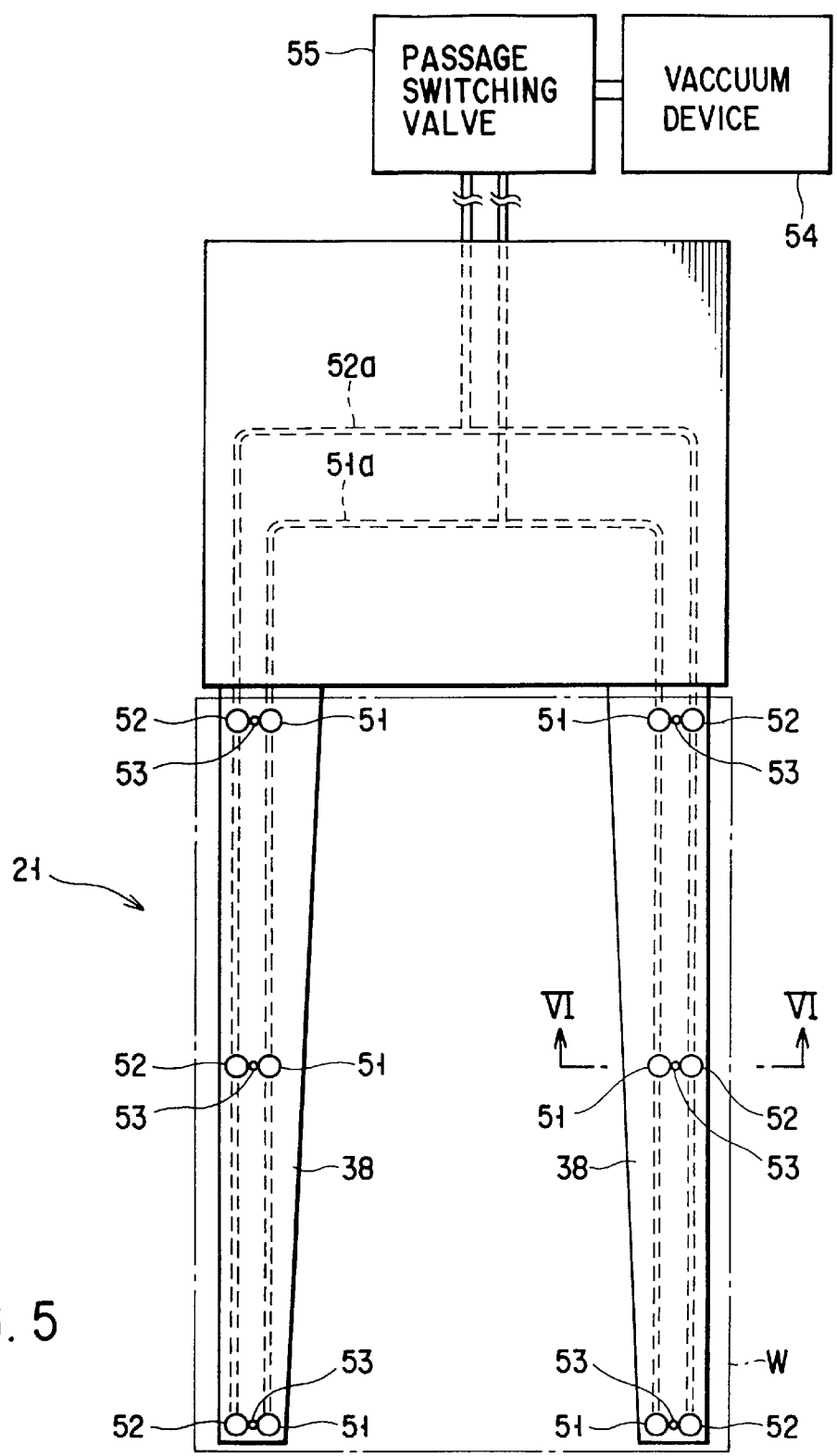
FIG. 5 is a plan view illustrating an embodiment having the structure in which the first and second adsorption pads are arranged on the arm such that the upper surfaces of these pads are leveled with each other.

FIG. 5 is a plan view of an embodiment in which a first suction pad 51 and a second suction pad 52 are provided at six locations on the upper surface of the arm 21 consisting of two arm members 38 as described before with reference to FIG. 4, in such a manner that these pairs of the first and second suction pads are arranged in symmetrical with respect to the center line 21' of the arm 21. In the embodiment illustrated, as to the first and second suction pads 51 and 52 making up each pair, the second pad 52 is always located outward of the first pad 51 with reference to the center line 21' of the arm 21. It should be noted that in this embodiment, the first and second suction pads 51 and 52 are provided at six locations on the upper surface of the arm 21; however the number of locations of the pads can be arbitrarily changed. Further, it is possible that the second suction pad 52 is situated inward of the first suction pad 51 with reference to the center line 21' of the arm 21. Moreover, in this embodiment, the first and second suction pads 51 and 52 are formed so that the upper surfaces thereof are leveled with each other in each pair.

To the first and second suction pads 51 and 52, suction pipes 51a and 52a are connected via the arm 21, and the pipes 51a and 52a are connected to a vacuum device 54 via a flow passage switching valve 55. The flow passage switching valve 55 serves to selectively switch over between the suction using the first suction pad 51 and the suction using the second suction pad 52.

Further, a projecting member 53 having the same height as the level of the upper surfaces of the first and second suction pads 51 and 52, is provided between the first and second pads in each pair.

Figure 7:
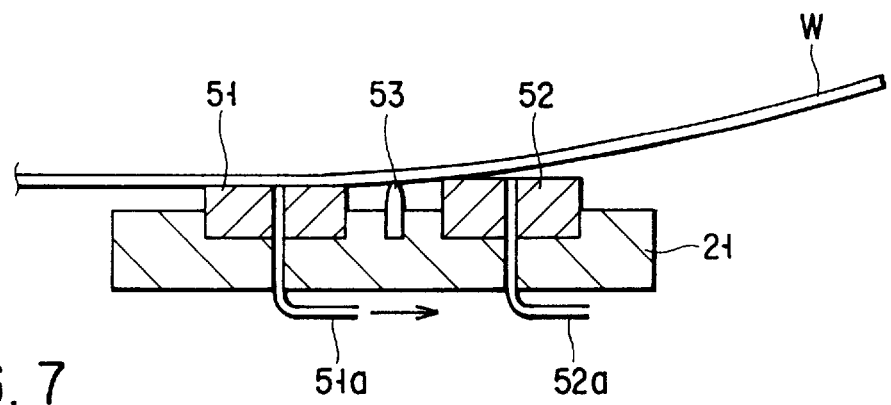
FIG. 7 is an explanatory diagram for illustrating the state in which a substrate before washing is conveyed, in connection with the embodiment shown in FIG. 5.
Figure 8:
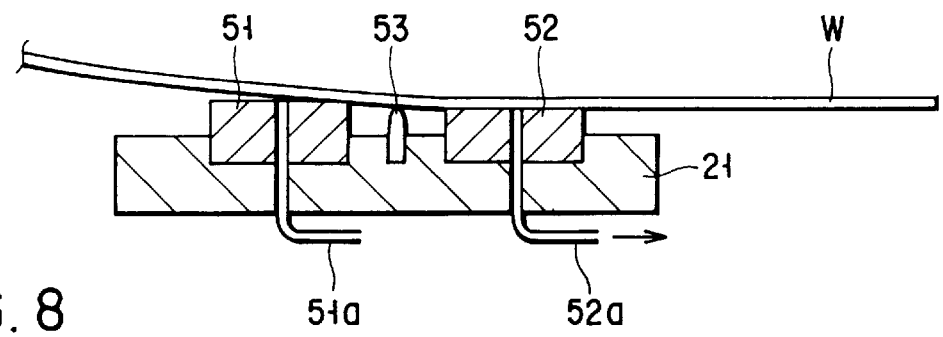
FIG. 8 is an explanatory diagram for illustrating the state in which a substrate after washing is conveyed, in connection with the embodiment shown in FIG. 5.

In this embodiment, for conveying an unwashed substrate W while being held on the arm 21, the lower surface of the substrate W is suctioned only by the first suction pad 51 as shown in FIG. 7, whereas for conveying a washed substrate W while being held on the arm 21, the lower surface of the substrate W is suctioned only by the second suction pad 51 as shown in FIG. 8. With this structure, while conveying an unwashed substrate W, the substrate W is held on the upper surface of the second suction pad 52 only by its weight. Consequently, a very small amount of contaminant is transferred from the lower surface of the substrate W to the upper surface of the second suction pad 52. On the other hand, while conveying a washed substrate W, the substrate W is held on the upper surface of the first suction pad 51 only by its weight. Consequently, a very small amount of contaminant is transferred from the lower surface of the substrate W to the upper surface of the first suction pad 51. In this manner, the re-attachment of the contaminant transferred from an unwashed substrate W to the first suction pad 51, onto a washed substrate W can be prevented. It should be noted that while conveying an unwashed substrate W, only the second suction pad 52 may be operated, whereas while conveying a washed substrate W, only the first suction pad 51 may be operated, in reverse to the above-described embodiment.

Further, in this embodiment, for conveying an unwashed substrate W while being held on the arm 21, the lower surface of the substrate W is suctioned only by the first suction pad 51 which is situated inward on the upper surface of the arm 21, the height of the upper surface of the first suction pad 51 is lowered as the substrate is suctioned since the pad is contracted due to its elasticity, has as shown in FIG. 7. Consequently, the top portion of the projecting member 53 provided between the first and second suction pads 51 and 52 relatively pushes up the lower surface of the substrate W at the section outward of the first suction pad 51. Therefore, as can be seen in FIG. 7, the substrate W is deformed into such a warped shape that the center portion of the substrate W is lowered and the outer side thereof is raised, and the section of the lower surface of the substrate W, which corresponds to the second suction pad 52, is separated from the upper surface of the second suction pad 52 which is situated outward of the first suction pad 51. By contrast, for conveying a washed substrate W while being held on the arm 21, the lower surface of the substrate W is suctioned only by the second suction pad 52 which is situated outward on the upper surface of the arm 21, the height of the upper surface of the second suction pad 52 is lowered as the substrate is suctioned since the pad is contracted due to its elasticity, has as shown in FIG. 8. Consequently, the top portion of the projecting member 53 provided between the first and second suction pads 51 and 52 relatively pushes up the lower surface of the substrate W at the section outward of the second suction pad 52. Therefore, as can be seen in FIG. 8, the substrate W is deformed into such a warped shape opposite to the above case, that the center portion of the substrate W is raised and the outer side thereof is lowered, and the section of the lower surface of the substrate W, which corresponds to the first suction pad 51, is separated from the upper surface of the first suction pad 51 which is situated inward of the second suction pad 52.

Figure 6:
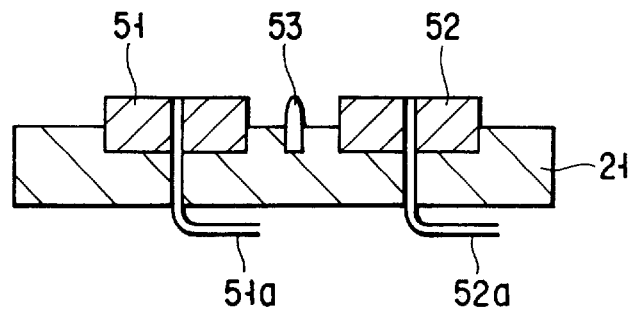
FIG. 6 is a cross sectional view taken along line A—A in FIG. 5.

As described above, according to the embodiment shown in FIG. 6, the states where only the first suction pad 51 is brought into contact with the lower surface of the substrate and where only the second suction pad 52 is brought into contact with the lower surface of the substrate are switched over between before and after washing. In this manner, the re-attachment of the contaminant transferred from an unwashed substrate W to the first suction pad 51, onto an washed substrate W can be prevented. It should be noted that while conveying an unwashed substrate W, only the second suction pad 52 may be operated, whereas while conveying a washed substrate W, only the first suction pad 52 may be operated, in reverse to the above-described embodiment.

In the meantime, a substrate conveying device 100 consists of a base 101 and an arm 103 made of two arm members 102 mounted onto the front surface of the base 101, as in the case of the arm 21 shown FIG. 4. Each of the arm member 102 can be rotated by an actuator provided in the base 101. Further, on the obverse and reverse surfaces of each arm member 102, the first suction pad 105 and the second suction pad 106 are provided respectively at three locations in each surface.

Figure 9:
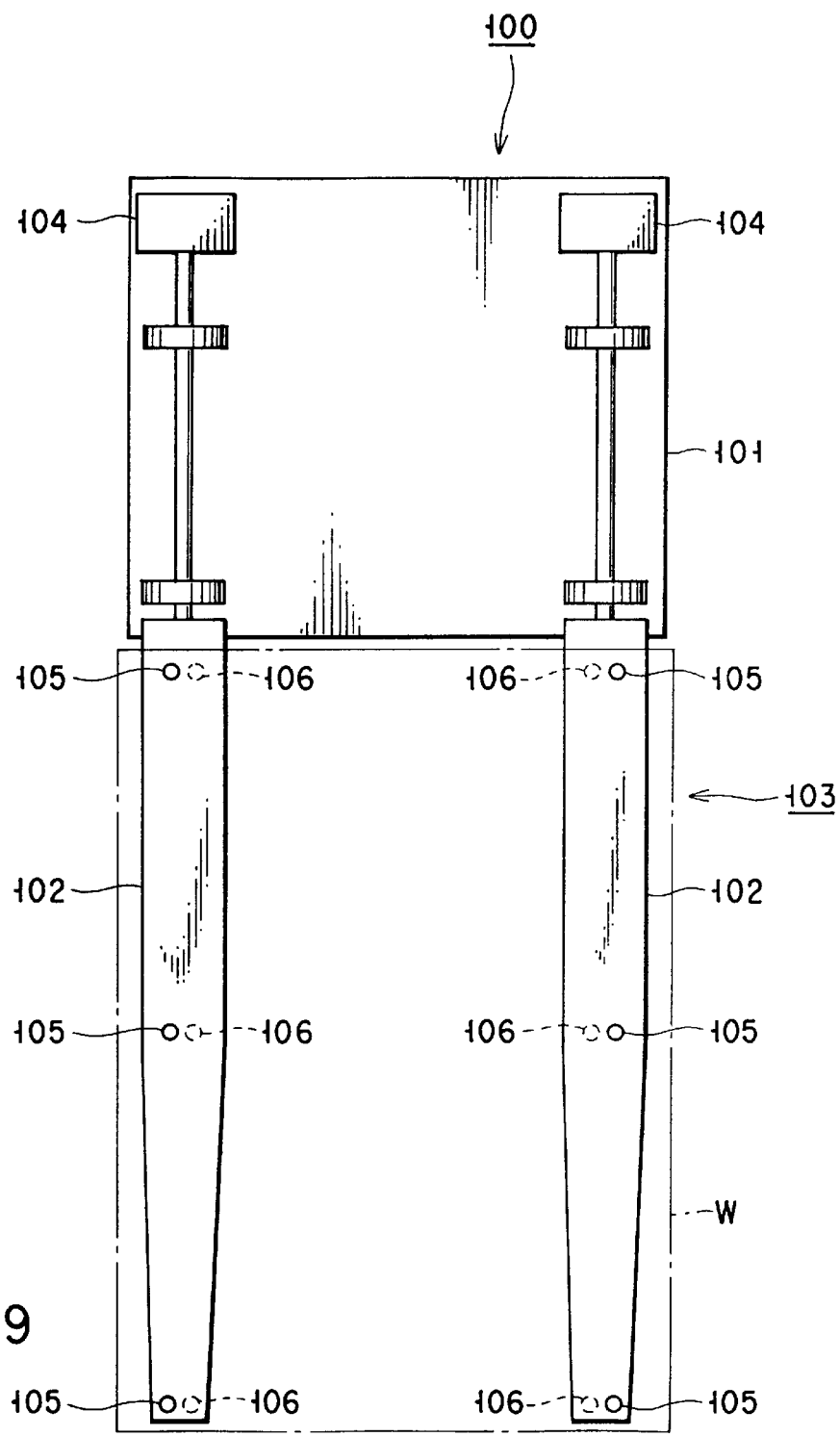
FIG. 9 is a plan view illustrating a substrate conveying device having a structure in which an arm is reversed.
Figure 10A:
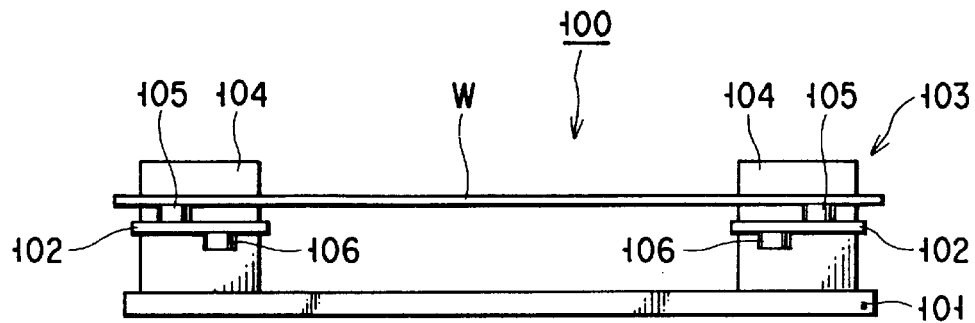
FIGS. 10A, 10B and 10C are explanatory diagrams illustrating the operation of the substrate conveying device shown in FIG. 9.
Figure 10B:
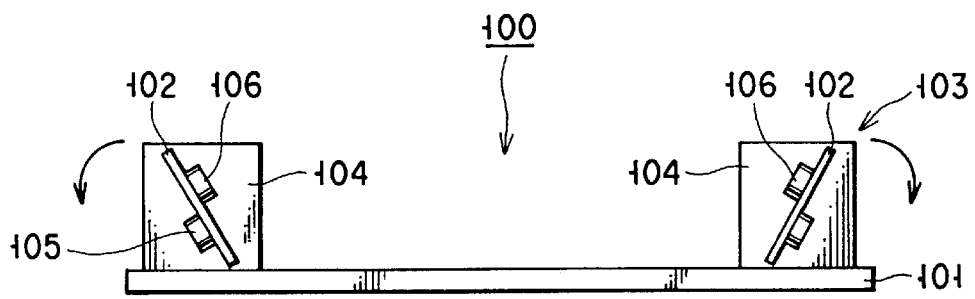
Figure 10C:
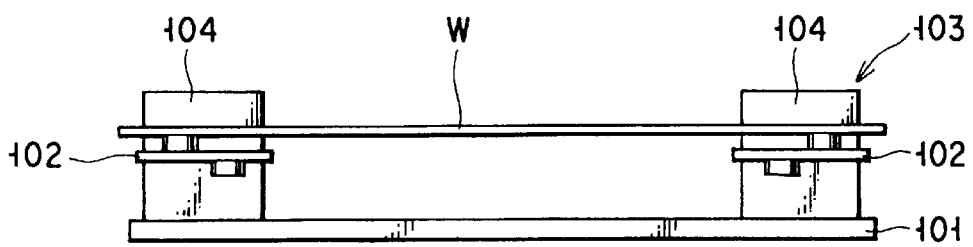

With the described structure, in the substrate conveying device 100 shown in FIG. 9, for conveying an unwashed substrate W while being held on the arm 103, the arm member 102 is postured such that the obverse surface of the arm member 102 face upwards and the first suction pads 105 are situated on the upper side, as can be seen in FIG. 10A. Thus, the lower surface of the substrate W is suctioned by the first suction pads 105. On the other hand, for conveying a washed substrate W, the air member 102 is rotated in advance by the actuator 104 so as to turn over the surface of the arm member 102 as can be seen in FIG. 10B. In this manner, the arm member 102 is postured such that the reverse surface of the arm member 102 face upwards and the second suction pads 106 are situated on the upper side, as can be seen in FIG. 10C. Thus, the lower surface of the substrate W is suctioned by the second suction pads 106. As described above, the arm member 102 is turned over, and the suction pads for suctioning the lower surface of a substrate W is switched over between before and after washing. In this manner, the re-attachment of the contaminant transferred from an unwashed substrate W to the first suction pads 105, onto an washed substrate W can be prevented. It should be noted that while conveying an unwashed substrate W, only the second suction pads 106 may be operated, whereas while conveying a washed substrate W, only the first suction pads 105 may be operated, in reverse to the above-described embodiment.

The present invention cannot be limited to the above-described embodiments, but it may be remodeled into various versions as long as the essence of the invention remains the same.

For example, preferable embodiments of the present invention were described in connection with the washing device 1 for washing substrates W; however it can be applied to various types of processing devices other than washing device, for example, the drying of a substrate, the formation of a resist film on a substrate, and the like.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A substrate conveying device for loading/unloading a substrate to/from a processing section, comprising:

an arm, having one surface and another surface, that holds said substrate;

an arm driver that drives said arm to load/unload said substrate to/from said processing section;

a first suction pad provided on said one surface of said arm to suction said substrate;

a second suction pad provided on said another surface of said arm to suction said substrate; and a switch that selectively swithes a mode between said first and second suction pads by turning said arm over.

2. A substrate conveying device according to claim 1, wherein said switch includes an actuator for rotating said arm.

3. A substrate conveying method for conveying a substrate with use of a substrate conveying device including, an arm holding said substrate thereon, first and second suction pads provided on said arm to selectively suction said substrate, a projecting member provided between said first and second suction pads of said arm; said method comprising the steps of:

loading an unprocessed substrate in said processing section while holding said unprocessed substrate by the first suction pad and said projecting member abutting the lower surface of the unprocessed substrate such that the unprocessed substrate is suctioned by said first suction pad; and unloading a processed substrate from said processing section while suctioning said processed substrate by the second suction pad and said projecting member abutting a lower surface of the unprocessed substrate such that the unprocessed substrate is suctioned by said second suction pad.

4. A method according to claim 3, wherein a processed substrate is suctioned by the second suction pad.

5. A method according to claim 3, wherein the first and second pads are placed substantially at a same level when the substrate is not held, and when the substrate is held, at least one of the first and second suction pads is elastically deformed and lowered in height than the other suction pad.

6. A method according to claim 5, wherein said projecting member is placed at the same level as those of the first and second suction pads when the substrate is not held.

7. A method according to claim 3, wherein a plurality of pairs of said first suction pad and said second pad are arranged at positions symmetrical with respect to a center line of said substrate, and one of the first and second suction pads is situated at an inner side of said substrate and the other of said first and second pads is situated at an outer side of said substrate in each pair.

8. A substrate conveying method for conveying a substrate by use of a substrate conveying device including, an arm that holds said substrate thereon, first suction pad provided on one surface of said arm, second suction pad provided on another surface of said arm, and a switching mechanism that switches a mode between said first and second suction pads for suctioning said substrate by turning said arm over; said method comprising the steps of:

loading an unprocessed substrate in said processing section while suctioning said unprocessed substrate by the first suction pad;

turning said arm such that the second suction pad is located at an upper side of the arm; and unloading a processed substrate from said processing section while suctioning said processed substrate by the second suction pad.

9. A method according to claim 8, wherein a processed substrate is suctioned with the second suction pad.

* * * * *